United States Patent

Kuo

Patent Number: 6,046,081
Date of Patent: Apr. 4, 2000

[54] METHOD FOR FORMING DIELECTRIC LAYER OF CAPACITOR

[75] Inventor: Chien-Li Kuo, Hsinchu, Taiwan

[73] Assignee: United Microelectronics Corp., Hsinchu, Taiwan

[21] Appl. No.: 09/330,246

[22] Filed: Jun. 10, 1999

[51] Int. Cl.[7] ................................................ H01L 21/70
[52] U.S. Cl. .......................................... 438/240; 438/785
[58] Field of Search .................................. 438/240, 287, 438/785, 591, 216, 396

[56] References Cited

U.S. PATENT DOCUMENTS

| | | | |
|---|---|---|---|
| 5,290,609 | 3/1994 | Horiike | 427/576 |
| 5,663,088 | 9/1997 | Sandhu | 438/396 |
| 5,688,724 | 11/1997 | Yoon | 437/235 |
| 5,837,593 | 11/1998 | Park | 438/396 |

OTHER PUBLICATIONS

Neilson, M.C, et al., "Low temperature deposition of high dielectric films using reactive pulsed DC magnetron sputtering", Dielectric Material Integration for Microelectronics, Pennington, NJ: Electrochem. Soc, 1998. p. 227–40. Conference: San Diego, CA, 1998.

*Primary Examiner*—Charles Bowers
*Assistant Examiner*—Matthew Whipple
*Attorney, Agent, or Firm*—Hickman Stephens Coleman & Hughes, LLP

[57] ABSTRACT

A method for forming the dielectric layer of a capacitor. A titanium layer and a tantalum pentoxide layer are sequentially formed over a polysilicon lower electrode. A high-temperature treatment is performed so that titanium in the titanium layer and silicon in the polysilicon lower electrode react to form a titanium silicide layer at their interface. Titanium in the titanium layer also reacts with oxygen in the atmosphere to form a titanium oxide layer at its interface with the tantalum pentoxide layer. The titanium silicide layer, the titanium oxide layer and the tantalum pentoxide layer together constitute a composite dielectric layer with a high dielectric constant capable of increasing the capacitance of the capacitor.

7 Claims, 2 Drawing Sheets

METHOD FOR FORMING DIELECTRIC LAYER OF CAPACITOR

BACKGROUND OF THE INVENTION

1. Field of Invention

The present invention relates to a method for forming a dielectric layer. More particularly, the present invention relates to a method for forming the dielectric layer of a dynamic random access memory (DRAM) capacitor capable of storing a greater amount of electric charges.

2. Description of Related Art

As microprocessors become more powerful, the amount of memory necessary to carry out software programming increases correspondingly. Hence, memory units having a capacitor with a high capacitance are in great demand. There are several means of increasing the charge storage capacity of a capacitor. A high dielectric constant material may be selected to form the dielectric layer of a capacitor so that more electric charges can be stored per unit area of the capacitor. A second method is to reduce the thickness of the dielectric layer. However, quality of the dielectric material is likely to set a limit on the minimum thickness a dielectric layer may have. Alternatively, one may try to increase the effective surface area of a capacitor so that the total number of electric charges stored within the capacitor is increased.

As level of device integration continues to increase, surface area for constructing a DRAM capacitor actually shrinks. Means of increasing charge storage capacity of a capacitor falls on choosing a high dielectric constant material. Since tantalum pentoxide ($Ta_2O_5$) has a high dielectric constant, it is one of the ideal materials for forming the dielectric layer of a capacitor. In general, a capacitor is formed by forming a polysilicon lower electrode over a substrate. A dielectric layer, preferably a tantalum pentoxide, is next deposited over the polysilicon electrode. The final step is to form a titanium nitride layer and a second polysilicon layer sequentially above the dielectric layer. The titanium nitride layer and the second polysilicon layer together form an upper electrode. To lower the amount of leakage current from the capacitor, a high-temperature treatment is usually carried out after the dielectric layer is formed. The high-temperature treatment is typically conducted in the presence of oxygen. However, oxygen is able to penetrate through the tantalum pentoxide layer and react with silicon in the lower polysilicon electrode. Therefore, a silicon oxide ($SiO_2$) layer is formed at the interface between the tantalum pentoxide layer and the lower electrode. Since the dielectric constant of silicon dioxide is rather low, capacitance or storage capacity of the capacitor is lowered.

Furthermore, a depletion region is formed next to the lower electrode resulting from an electric field generated by applied voltages. The presence of a depletion region in the capacitor reduces the capacitance of the capacitor even further.

SUMMARY OF THE INVENTION

The invention provides a method of forming the dielectric layer of a capacitor. A transistor is formed over a substrate. The transistor has a gate and a pair of source/drain regions. A dielectric layer is formed over the substrate and the transistor. An opening that exposes a portion of the source/drain region in the dielectric layer is formed. Conductive material is deposited to fill the opening and cover the dielectric layer. The conductive layer is patterned to form a lower electrode that couples with the source/drain region. A patterned titanium layer is formed over the lower electrode. Tantalum pentoxide is deposited over the titanium layer to form a dielectric layer. A high-temperature treatment is carried out in an atmosphere with an adjustable supply of oxygen. An upper electrode is formed over the tantalum pentoxide layer.

In the high-temperature treatment, titanium in the titanium layer reacts with silicon in the polysilicon lower electrode to form a titanium silicide (TiSx) layer at their interface. Meanwhile, titanium in the titanium layer also reacts with supplied oxygen in the surrounding atmosphere to form a titanium oxide (TiOx) layer at the interface with the tantalum pentoxide layer. The titanium silicide layer, the titanium oxide layer and the tantalum pentoxide layer together form the dielectric layer of a capacitor. In this invention, thickness of the titanium silicide layer and the titanium oxide layer can be adjusted by controlling the thickness of the titanium layer and controlling the supply of oxygen.

The titanium oxide layer in the dielectric layer produced by the method of this invention has a dielectric constant much higher than that of the silicon dioxide layer produced by the penetration of oxygen through a tantalum pentoxide layer using a conventional method. The titanium oxide layer even has a dielectric constant higher than the tantalum pentoxide layer itself. With a higher dielectric constant, the charge storage capacity of the capacitor is thereby increased.

In addition, due to the formation of a highly conductive titanium silicide layer next to the lower electrode, no depletion layers are formed in the neighborhood of the polysilicon lower electrode. Thus, capacitance of the capacitor can be maintained.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
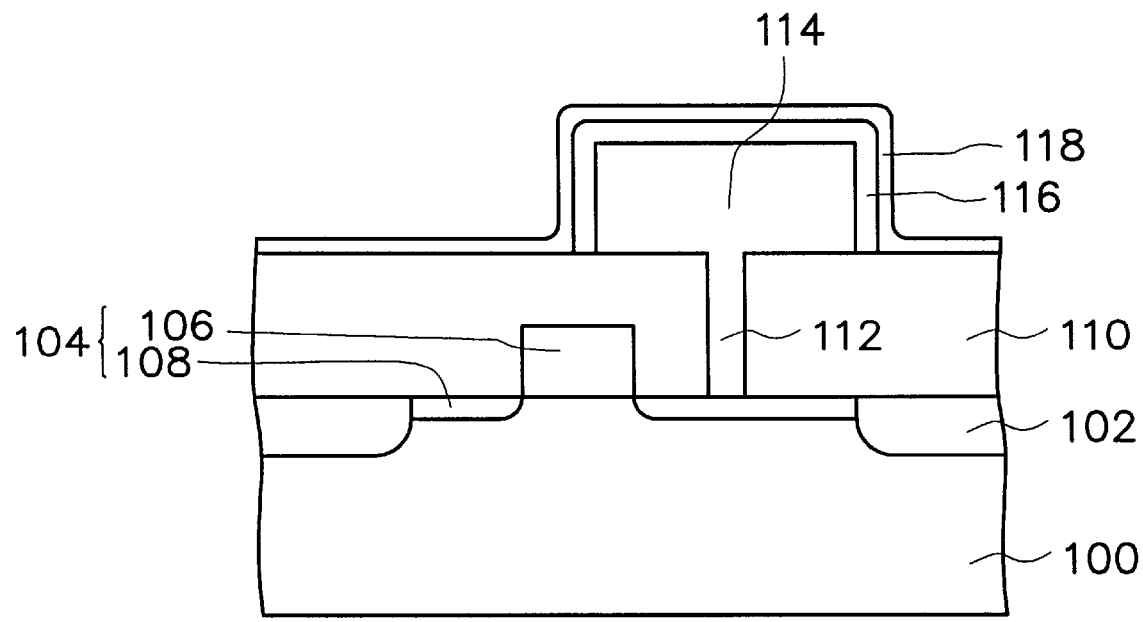
FIGS. 1A through 1C are schematic, cross-sectional views showing the progression of steps for forming a DRAM capacitor having a dielectric layer fabricated according to the embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Figure 1B:
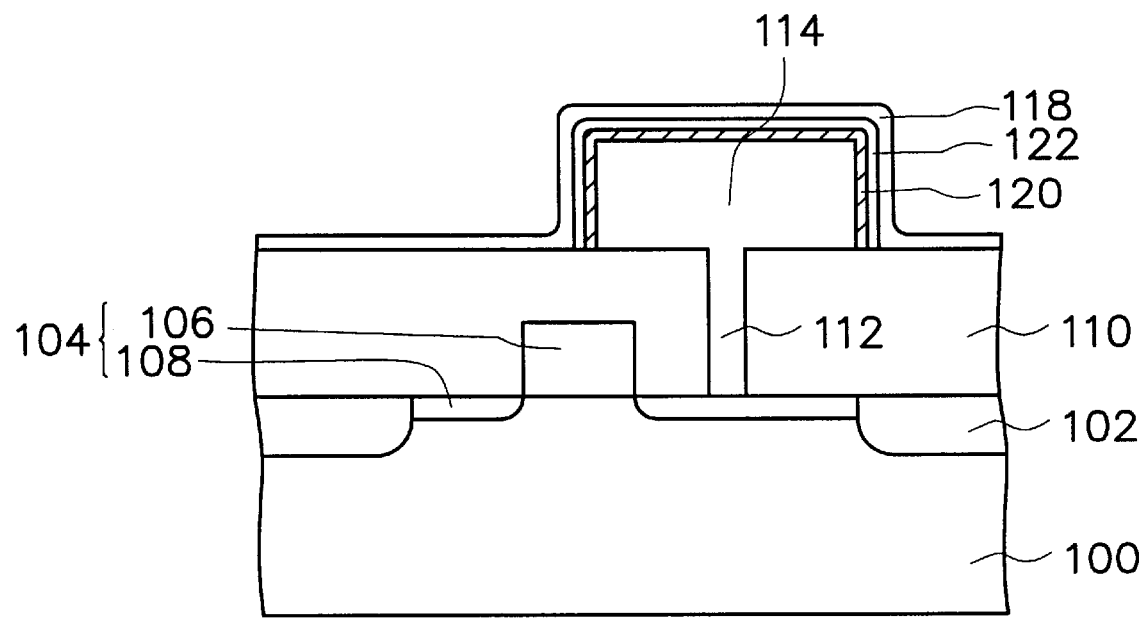
Figure 1C:
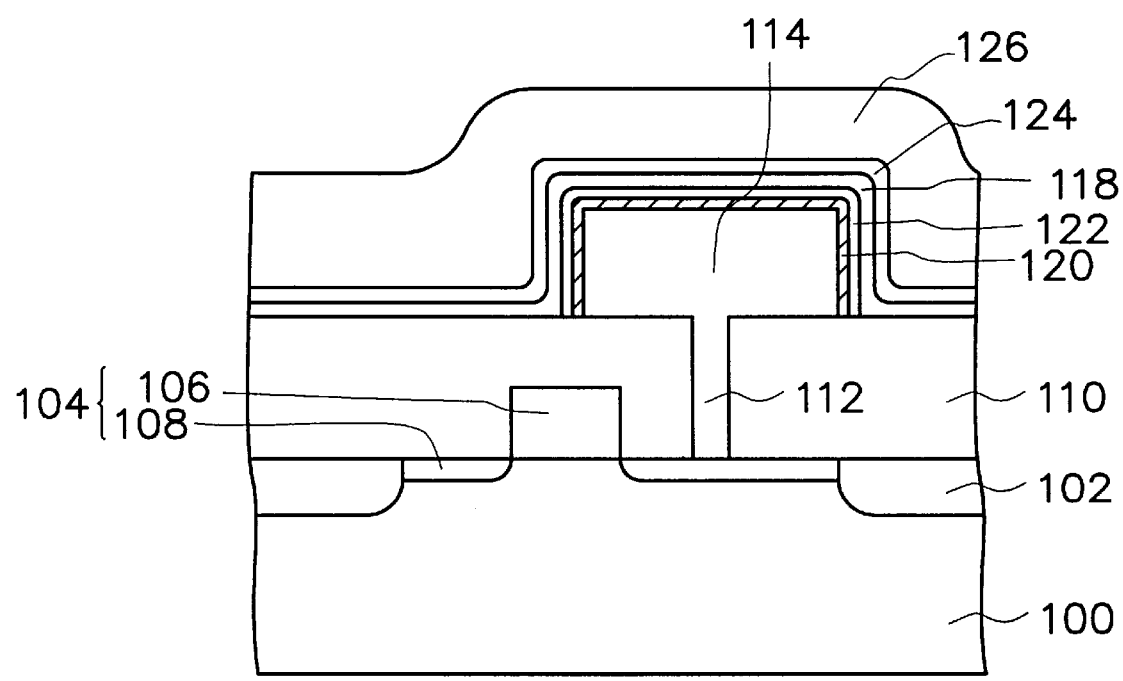

FIGS. 1A through 1C are schematic, cross-sectional views showing the progression of steps for forming a DRAM capacitor having a dielectric layer fabricated according to the embodiment of the invention.

As shown in FIG. 1A, a substrate having a device isolation structure 102 thereon is provided. The device isolation structure 102, for example, can be a shallow trench isolation (STI). Metal oxide semiconductor (MOS) transistor 104 is formed on the substrate 100. The MOS transistor 104 comprises a gate 106 and a source/drain region 108. A patterned dielectric layer 110 is formed over the substrate 100. The patterned dielectric layer 110 has a storage node opening 112 that exposes a portion of the source/drain region 108. A lower electrode 114 is formed on top of the dielectric layer 110. The lower electrode 114 is formed, for example, by depositing conductive material such as polysilicon into the opening 112 and over the dielectric layer 110 to form a conductive layer (not shown). The conductive layer is patterned to form an electrode 114 with a specific shape. The electrode 114 is connected to the source/drain region 108 by the conductive material inside the contact opening 112. In this embodiment of the invention, the lower electrode 114 has a cylindrical shape. However, the electrode can also be some other kind of geometric shape. A patterned titanium layer 116 is formed over the substrate 100 and covers the lower electrode 114. A tantalum pentoxide layer 118 is formed over the titanium layer 116 and the dielectric layer 110. The patterned titanium layer 116 is formed, for example, by depositing titanium over the dielectric layer 110 and the electrode 114, and patterning the titanium layer using conventional photolithographic and etching processes.

As shown in FIG. 1B, a high-temperature treatment is performed in an atmosphere with an adjustable supply of oxygen. Titanium in the titanium layer 116 reacts with polysilicon in the lower electrode 114 to form a titanium silicide (TiSix) layer 120 at their interface. Meanwhile, titanium in the titanium layer 116 reacts with oxygen in the surrounding atmosphere to form a titanium oxide (TiOx) layer 122 at its interface with the tantalum pentoxide layer 118. The tantalum pentoxide layer 118, the titanium oxide layer 122 and the titanium silicide layer 120 together constitute a composite dielectric layer for the capacitor.

As shown in FIG. 1C, an upper electrode is formed over the tantalum pentoxide layer 118. The upper electrode can be formed, for example, by forming a titanium silicide layer 124 over the tantalum pentoxide layer 118, and forming a polysilicon layer 126 over the titanium silicide layer 124. In the embodiment of this invention, the upper electrode is composed of the titanium silicide layer 124 and the polysilicon layer 126. However, the upper electrode can have other kinds of structures composed of other materials.

In this invention, thickness of the titanium silicide layer 120 and the titanium oxide layer 122 can be adjusted by controlling the thickness of the titanium layer 116 and controlling the flow of oxygen during high-temperature treatment.

Oxygen reacts with titanium in the titanium layer 116 to form a titanium oxide layer 122 at the interface with the tantalum pentoxide layer 118. This titanium oxide layer 122 has a dielectric constant of about 67, while the tantalum pentoxide layer 118 has a dielectric constant of about 25. In contrast, a silicon dioxide layer due to oxygen penetrating through the tantalum pentoxide layer in a conventional high-temperature treatment has a dielectric constant of just 3.5. Hence, dielectric constant of the dielectric layer produced by the method of this invention is a big improvement, capable of considerably increasing the storage capacity of a capacitor.

In addition, the titanium silicide layer 120 formed next to the lower electrode 114 is a good conductive layer.

Consequently, a depletion layer is no longer formed in the lower electrode and the lowering of capacitance is prevented.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of forming the dielectric layer of a capacitor, comprising the steps of:

providing a lower electrode;

forming a titanium layer on the lower electrode;

depositing tantalum pentoxide over the titanium layer; and performing a high-temperature treatment in an atmosphere of oxygen to form a titanium oxide layer at an interface between the tantalum pentoxide layer and the titanium layer.

2. The method of claim 1, wherein the step of performing the high-temperature treatment further includes adjusting a flow of oxygen into the atmosphere.

3. The method of claim 1, wherein the lower electrode includes a polysilicon layer.

4. A method of forming a capacitor, comprising the steps of:

forming a transistor over a substrate, wherein the transistor contains a gate and a source/drain region;

forming a patterned dielectric layer over the substrate and the transistor, wherein the patterned dielectric layer has a storage node opening that exposes a portion of the source/drain region;

depositing conductive material to fill the node opening and cover the dielectric layer, thereby forming a lower electrode that couples electrically with the source/drain region;

forming a patterned titanium layer over the lower electrode;

forming a tantalum pentoxide layer over the titanium layer;

performing a high-temperature treatment in an atmosphere with oxygen; and forming an upper electrode over the tantalum pentoxide layer.

5. The method of claim 4, wherein the lower electrode includes a polysilicon layer.

6. The method of claim 4, wherein the step of performing the high-temperature treatment further includes adjusting a flow of oxygen into the atmosphere.

7. The method of claim 4, wherein the step of forming the upper electrode includes the substeps of:

forming a titanium silicide layer over the tantalum pentoxide layer, and forming a polysilicon layer over the titanium silicide layer.

* * * * *